US008525717B2

(12) United States Patent
Khlat

(10) Patent No.: US 8,525,717 B2
(45) Date of Patent: Sep. 3, 2013

(54) HALF-BANDWIDTH BASED QUADRATURE ANALOG-TO-DIGITAL CONVERTER

(75) Inventor: Nadim Khlat, Cugnaux (FR)

(73) Assignee: RF Micro Devices, Inc., Greensboro, NC (US)

( * ) Notice: Subject to any disclaimer, the term of this patent is extended or adjusted under 35 U.S.C. 154(b) by 125 days.

(21) Appl. No.: 13/209,485

(22) Filed: Aug. 15, 2011

(65) Prior Publication Data

US 2012/0206285 A1 Aug. 16, 2012

Related U.S. Application Data

(60) Provisional application No. 61/373,584, filed on Aug. 13, 2010.

(51) Int. Cl.
*H03M 1/12* (2006.01)
(52) U.S. Cl.
USPC .......... 341/155; 455/339; 455/118; 455/131; 375/322
(58) Field of Classification Search
USPC ............... 341/155; 375/322, 321, 340, 141; 455/339, 131, 75, 68, 108, 118
See application file for complete search history.

(56) References Cited

U.S. PATENT DOCUMENTS

| | | | | |
|---|---|---|---|---|
| 6,600,438 B2* | 7/2003 | Hilton | | 341/155 |
| 6,611,569 B1* | 8/2003 | Schier et al. | | 375/322 |
| 6,683,905 B1* | 1/2004 | King et al. | | 375/141 |
| 7,049,992 B1* | 5/2006 | Hilton | | 341/155 |
| 7,127,008 B2* | 10/2006 | Kroeger | | 375/321 |
| 7,446,692 B2* | 11/2008 | Volnhals | | 341/155 |
| 2003/0080890 A1* | 5/2003 | Hilton | | 341/155 |
| 2006/0092056 A1* | 5/2006 | Hilton | | 341/118 |
| 2009/0325518 A1* | 12/2009 | Mattisson et al. | | 455/131 |

* cited by examiner

*Primary Examiner* — Jean B Jeanglaude

(74) *Attorney, Agent, or Firm* — Withrow & Terranova, P.L.L.C.

(57) ABSTRACT

A half-bandwidth based quadrature analog-to-digital converter (ADC) includes in-phase circuitry, quadrature-phase circuitry, and digital complex processing circuitry. The in-phase circuitry includes an in-phase pair of ADCs, which provide an in-phase pair of sub-quadrature output signals, based on an analog in-phase input signal. Similarly, the quadrature-phase circuitry includes a quadrature-phase pair of ADCs, which provide a quadrature-phase pair of sub-quadrature output signals based on an analog quadrature-phase input signal. The digital complex processing circuitry combines, filters, and restructures the in-phase pair of sub-quadrature output signals and the quadrature-phase pair of sub-quadrature output signals to provide a digital in-phase output signal and a digital quadrature-phase output signal. Each of the in-phase pair of ADCs has about an ADC bandwidth. The in-phase circuitry has an input bandwidth, which is about equal to two times the ADC bandwidth in one embodiment of the in-phase circuitry.

25 Claims, 10 Drawing Sheets

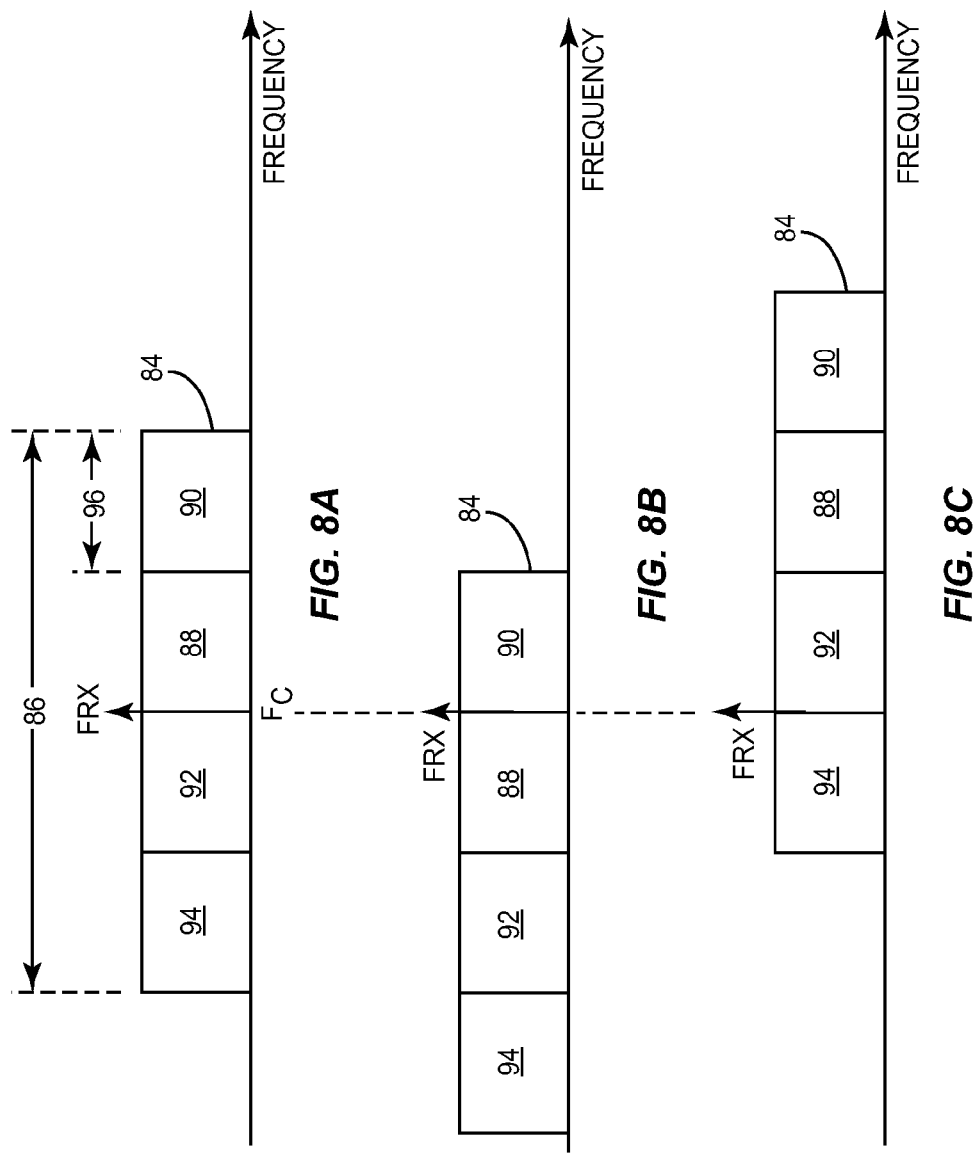

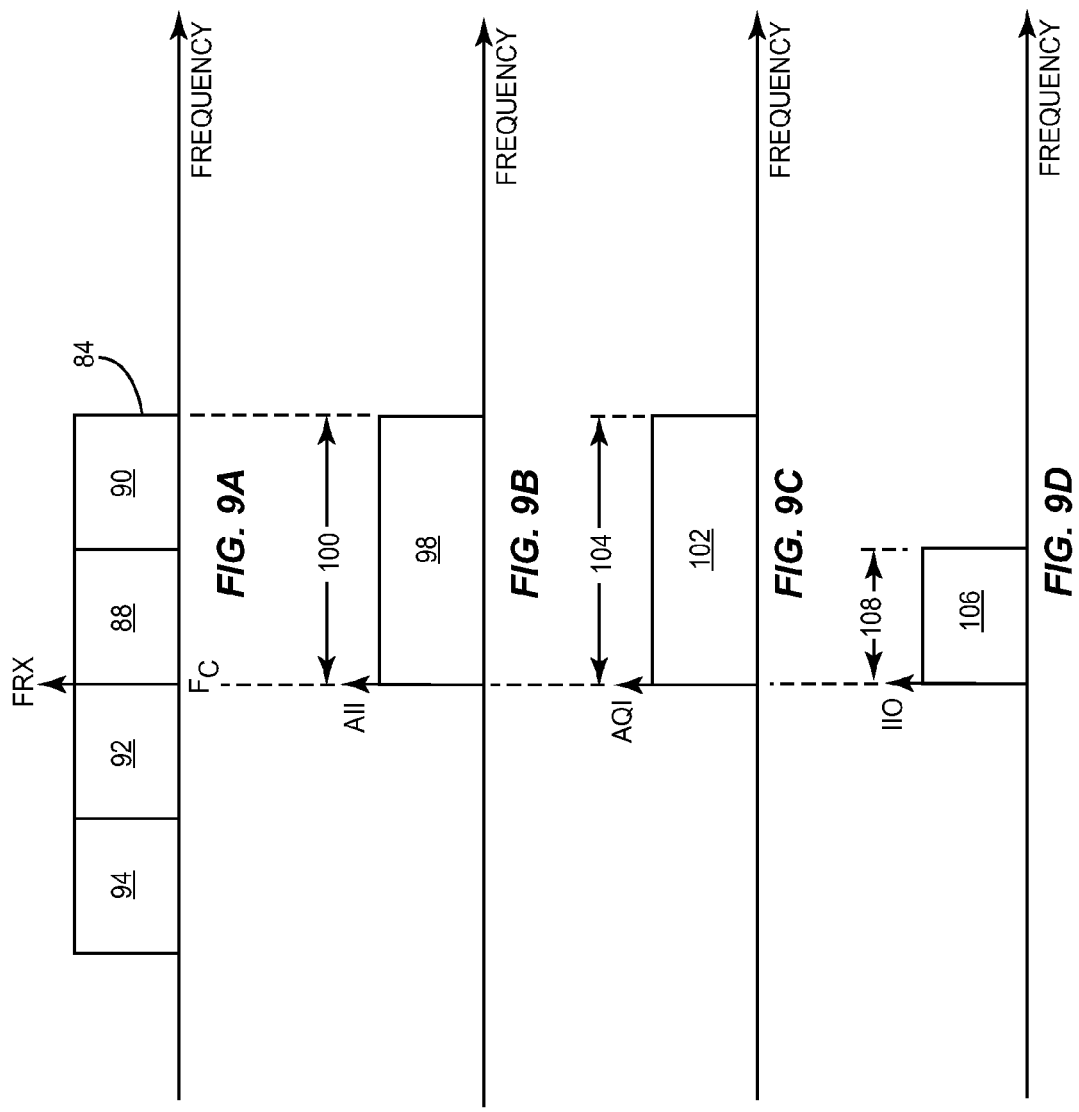

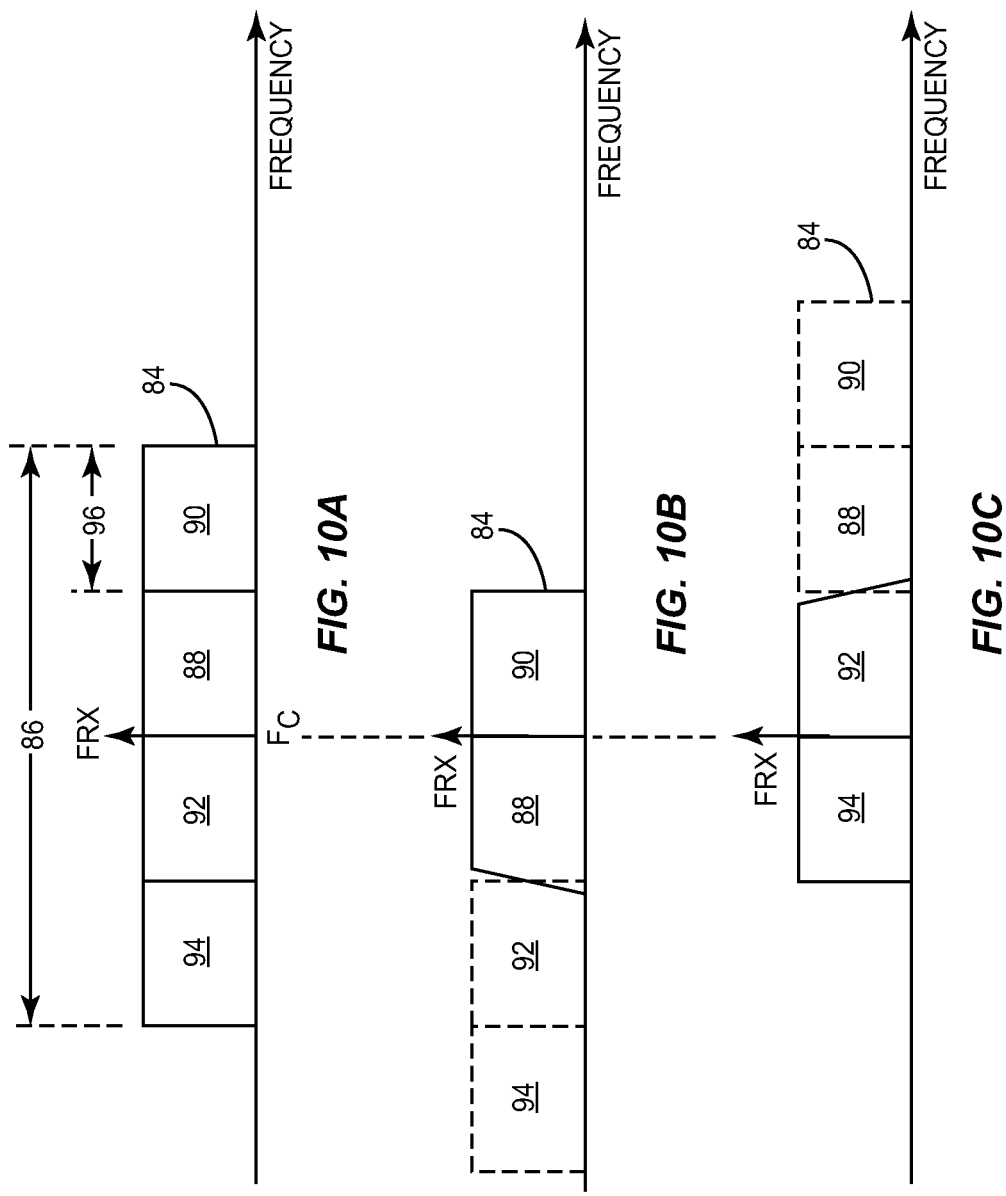

HALF-BANDWIDTH BASED QUADRATURE ANALOG-TO-DIGITAL CONVERTER

The present application claims the benefits of U.S. Provisional Patent Application Ser. No. 61/373,584, filed Aug. 13, 2010, the disclosure of which is hereby incorporated herein by reference in its entirety.

FIELD OF THE DISCLOSURE

Embodiments of the present disclosure relate to quadrature analog-to-digital converters (ADCs), which may be used in RF communications systems.

BACKGROUND OF THE DISCLOSURE

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, including protocols that operate using different communications modes, such as a half-duplex mode or a full-duplex mode, and including protocols that operate using different frequency bands. Further, the different communications modes may include different types of RF modulation modes, each of which may have certain performance requirements, such as specific out-of-band emissions requirements or symbol differentiation requirements.

Additionally, portable wireless communications devices are typically battery powered, need to be relatively small, and have low cost. As such, to minimize size, cost, and power consumption, multi-mode multi-band RF circuitry in such a device needs to be as simple, small, and efficient as is practical. Thus, there is a need for multi-mode multi-band RF circuitry in a multi-mode multi-band communications device that is low cost, small, simple, efficient, and meets performance requirements.

SUMMARY OF THE EMBODIMENTS

The present disclosure relates to a half-bandwidth based quadrature analog-to-digital converter (ADC), which includes in-phase circuitry, quadrature-phase circuitry, and digital complex processing circuitry. The in-phase circuitry includes an in-phase pair of ADCs, which provide an in-phase pair of sub-quadrature output signals, based on an analog in-phase input signal. Similarly, the quadrature-phase circuitry includes a quadrature-phase pair of ADCs, which provide a quadrature-phase pair of sub-quadrature output signals based on an analog quadrature-phase input signal. The digital complex processing circuitry combines, filters, and restructures the in-phase pair of sub-quadrature output signals and the quadrature-phase pair of sub-quadrature output signals to provide a digital in-phase output signal and a digital quadrature-phase output signal. Each of the in-phase pair of ADCs has about an ADC bandwidth. The in-phase circuitry has an input bandwidth, which is about equal to two times the ADC bandwidth in one embodiment of the in-phase circuitry. Similarly, each of the quadrature-phase pair of ADCs has about the ADC bandwidth. The quadrature-phase circuitry has an input bandwidth, which is about equal to two times the ADC bandwidth in one embodiment of the quadrature-phase circuitry. Using ADCs having one-half the input bandwidth may reduce current consumption, thereby extending battery life.

In an alternate embodiment of the half-bandwidth based quadrature ADC, the half-bandwidth based quadrature ADC operates in one of multiple ADC operating modes, which include at least a first ADC operating mode and a second ADC operating mode. During the first ADC operating mode, the half-bandwidth based quadrature ADC operates as described above, such that the input bandwidths are about equal to two times the ADC bandwidth. However, in certain operating conditions, wide input bandwidths are not required. As such, during a second ADC operating mode, one of each pair of ADCs is disabled, thereby reducing current consumption and extending battery life. However, during the second ADC operating mode, the input bandwidths are about equal to the ADC bandwidth.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 8A shows a first RF receive signal provided by the multi-mode multi-band RF communications terminal illustrated in FIG. 3 according to one embodiment of the multi-mode multi-band RF communications terminal.

FIG. 8B shows a first manipulation of the first RF receive signal illustrated in FIG. 8A according to one embodiment of the half-bandwidth based quadrature ADC.

FIG. 8C shows a second manipulation of the first RF receive signal illustrated in FIG. 8A according to one embodiment of the half-bandwidth based quadrature ADC.

FIG. 9A is a duplication of the first RF receive signal illustrated in FIG. 8A for clarity.

FIG. 9B shows an analog in-phase input signal illustrated in FIG. 5 according to one embodiment of the half-bandwidth based quadrature ADC.

FIG. 9C shows an analog quadrature-phase input signal illustrated in FIG. 5 according to one embodiment of the half-bandwidth based quadrature ADC.

FIG. 9D shows an I-side in-phase output signal illustrated in FIG. 5 according to one embodiment of the half-bandwidth based quadrature ADC.

FIG. 10A is a duplication of the first RF receive signal illustrated in FIG. 8A for clarity.

FIG. 10B shows effects of filtering the first RF receive signal illustrated in FIG. 8B according to one embodiment of the half-bandwidth based quadrature ADC.

FIG. 10C shows effects of filtering the first RF receive signal illustrated in FIG. 8C according to one embodiment of the half-bandwidth based quadrature ADC.

DETAILED DESCRIPTION OF THE PREFERRED EMBODIMENTS

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to a half-bandwidth based quadrature analog-to-digital converter (ADC), which includes in-phase circuitry, quadrature-phase circuitry, and digital complex processing circuitry. The in-phase circuitry includes an in-phase pair of ADCs, which provide an in-phase pair of sub-quadrature output signals, based on an analog in-phase input signal. Similarly, the quadrature-phase circuitry includes a quadrature-phase pair of ADCs, which provide a quadrature-phase pair of sub-quadrature output signals based on an analog quadrature-phase input signal. The digital complex processing circuitry combines, filters, and restructures the in-phase pair of sub-quadrature output signals and the quadrature-phase pair of sub-quadrature output signals to provide a digital in-phase output signal and a digital quadrature-phase output signal. Each of the in-phase pair of ADCs has about an ADC bandwidth. The in-phase circuitry has an input bandwidth, which is about equal to two times the ADC bandwidth in one embodiment of the in-phase circuitry. Similarly, each of the quadrature-phase pair of ADCs has about the ADC bandwidth. The quadrature-phase circuitry has an input bandwidth, which is about equal to two times the ADC bandwidth in one embodiment of the quadrature-phase circuitry. Using ADCs having one-half the input bandwidth may reduce current consumption, thereby extending battery life.

In an alternate embodiment of the half-bandwidth based quadrature ADC, the half-bandwidth based quadrature ADC operates in one of multiple ADC operating modes, which include at least a first ADC operating mode and a second ADC operating mode. During the first ADC operating mode, the half-bandwidth based quadrature ADC operates as described above, such that the input bandwidths are about equal to two times the ADC bandwidth. However, in certain operating conditions, wide input bandwidths are not required. As such, during a second ADC operating mode, one of each pair of ADCs is disabled, thereby reducing current consumption and extending battery life. However, during the second ADC operating mode, the input bandwidths are about equal to the ADC bandwidth.

Figure 1:
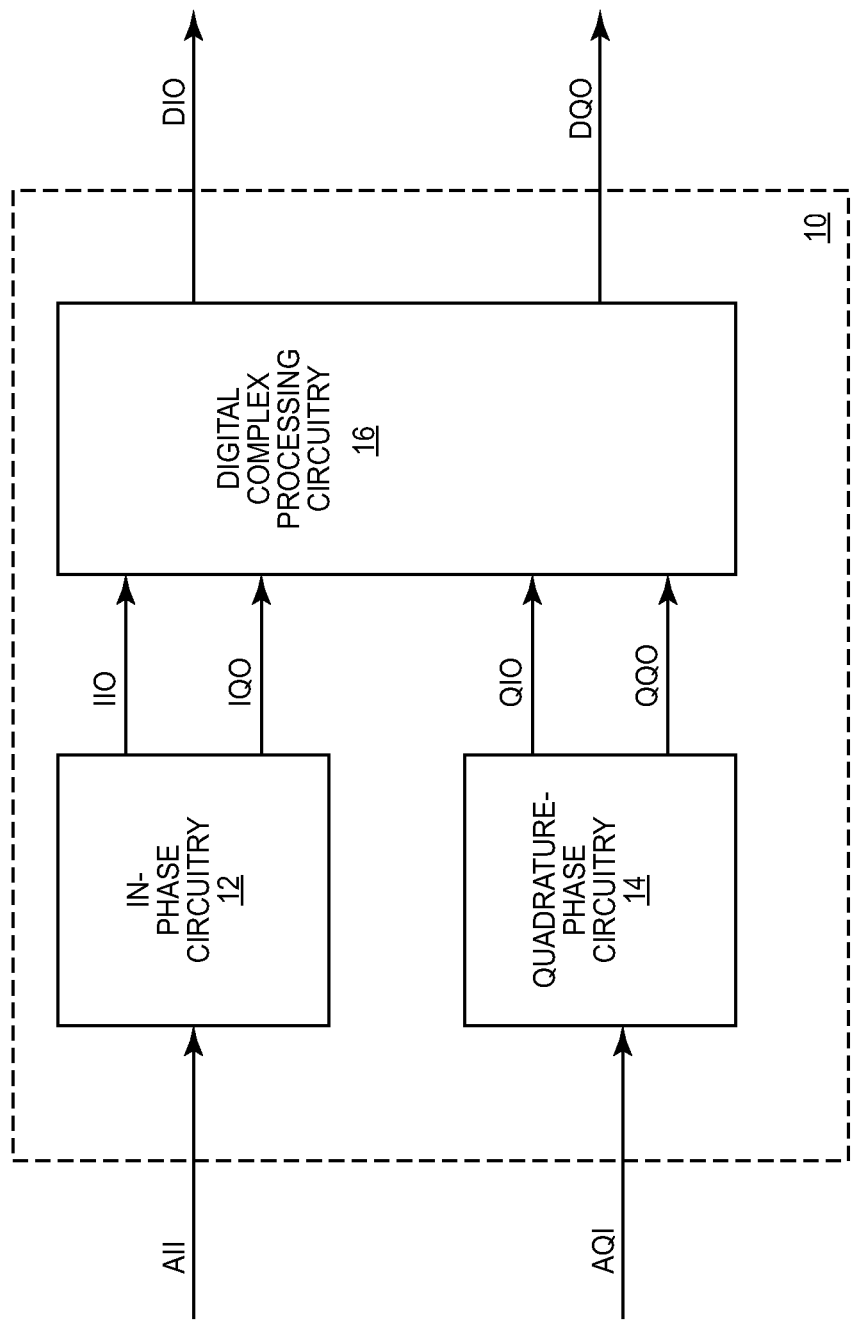
FIG. 1 shows a half-bandwidth based quadrature analog-to-digital converter (ADC) according to one embodiment of the half-bandwidth based quadrature ADC.

FIG. 1 shows a half-bandwidth based quadrature ADC 10 according to one embodiment of the half-bandwidth based quadrature ADC 10. The half-bandwidth based quadrature ADC 10 includes in-phase circuitry 12, quadrature-phase circuitry 14, and digital complex processing circuitry 16. As such, in one embodiment of the half-bandwidth based quadrature ADC 10, the in-phase circuitry 12, the quadrature-phase circuitry 14, and the digital complex processing circuitry 16 provide the half-bandwidth based quadrature ADC 10. The in-phase circuitry 12 receives an analog in-phase input signal AII and provides an I-side in-phase output signal IIO and an I-side quadrature-phase output signal IQO based on the analog in-phase input signal AII. The quadrature-phase circuitry 14 receives an analog quadrature-phase input signal AQI and provides a Q-side in-phase output signal QIO and a Q-side quadrature-phase output signal QQO based on the analog quadrature-phase input signal AQI. The digital complex processing circuitry 16 combines, filters, and restructures the I-side in-phase output signal IIO, the I-side quadrature-phase output signal IQO, the Q-side in-phase output signal QIO, and the Q-side quadrature-phase output signal QQO to provide a digital in-phase output signal DIO and a digital quadrature-phase output signal DQO. In general, the digital complex processing circuitry 16 processes the I-side in-phase output signal IIO, the I-side quadrature-phase output signal IQO, the Q-side in-phase output signal QIO, and the Q-side quadrature-phase output signal QQO to provide the digital in-phase output signal DIO and the digital quadrature-phase output signal DQO.

The analog in-phase input signal AII is an analog signal, and the I-side in-phase output signal IIO and the I-side quadrature-phase output signal IQO are digital signals. The analog quadrature-phase input signal AQI is an analog signal, and the Q-side in-phase output signal QIO and the Q-side quadrature-phase output signal QQO are digital signals. The digital in-phase output signal DIO and the digital quadrature-phase output signal DQO are digital signals. The analog quadrature-phase input signal AQI may be phase shifted from the analog in-phase input signal AII by about 90 degrees. The I-side quadrature-phase output signal IQO may be phase shifted from the I-side in-phase output signal IIO by about 90 degrees. The Q-side quadrature-phase output signal QQO may be phase shifted from the Q-side in-phase output signal QIO by about 90 degrees. The digital quadrature-phase output signal DQO may be phase shifted from the digital in-phase output signal DIO by about 90 degrees.

Figure 2:
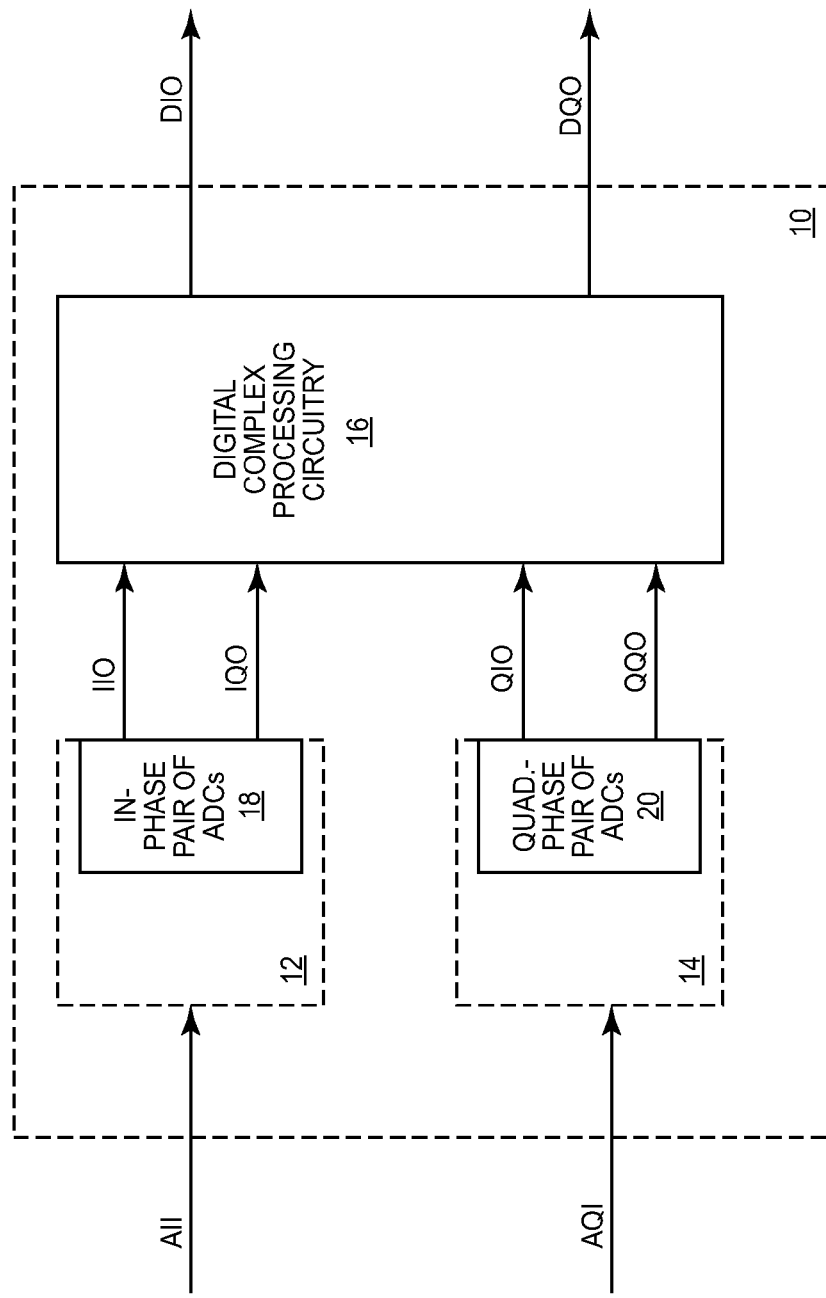
FIG. 2 shows details of in-phase circuitry and quadrature-phase circuitry illustrated in FIG. 1 according to one embodiment of the in-phase circuitry and the quadrature-phase circuitry.

FIG. 2 shows details of the in-phase circuitry 12 and the quadrature-phase circuitry 14 illustrated in FIG. 1 according to one embodiment of the in-phase circuitry 12 and the quadrature-phase circuitry 14. The in-phase circuitry 12 includes an in-phase pair 18 of ADCs and the quadrature-phase circuitry 14 includes a quadrature-phase pair 20 of ADCs. The in-phase pair 18 of ADCs provides an in-phase pair of sub-quadrature output signals based on the analog in-phase input signal AII. The in-phase pair of sub-quadrature output signals include the I-side in-phase output signal IIO and the U-side quadrature-phase output signal IQO. The quadrature-phase pair 20 of ADCs provides a quadrature-phase pair of sub-quadrature output signals based on the analog quadrature-phase input signal AQI. The quadrature-phase pair of sub-quadrature output signals includes the Q-side in-phase output signal QIO and the Q-side quadrature-phase output signal QQO. The digital complex processing circuitry 16 combines, filters, and restructures the in-phase pair of sub-quadrature output signals and the quadrature-phase pair of sub-quadrature output signals to provide the digital in-phase output signal DIO and the digital quadrature-phase output signal DQO. In general, the digital complex processing circuitry 16 processes the in-phase pair of sub-quadrature output signals and the quadrature-phase pair of sub-quadrature output signals to provide the digital in-phase output signal DIO and the digital quadrature-phase output signal DQO.

In one embodiment of the half-bandwidth based quadrature ADC 10, each of the in-phase pair 18 of ADCs has about an ADC bandwidth and the in-phase circuitry 12 has an input bandwidth, which is about equal to two times the ADC bandwidth. Further, each of the quadrature-phase pair 20 of ADCs has about the ADC bandwidth and the quadrature-phase circuitry 14 has an input bandwidth, which is about equal to two times the ADC bandwidth. In an alternate embodiment of the half-bandwidth based quadrature ADC 10, each of the in-phase pair 18 of ADCs has about an ADC bandwidth and the in-phase circuitry 12 has an input bandwidth, which is about equal to two times the ADC bandwidth. Further, each of the quadrature-phase pair 20 of ADCs has about the ADC bandwidth and the quadrature-phase circuitry 14 has an input bandwidth, which is about equal to two times the ADC bandwidth. In an exemplary embodiment of the half-bandwidth based quadrature ADC 10, the ADC bandwidth is equal to about 5 megahertz, the input bandwidth of the in-phase circuitry 12 is equal to about 10 megahertz, and the input bandwidth of the quadrature-phase circuitry 14 is equal to about 10 megahertz.

In one embodiment of the half-bandwidth based quadrature ADC 10, the half-bandwidth based quadrature ADC 10 operates in one of multiple ADC operating modes, which include at least a first ADC operating mode and a second ADC operating mode. During the first ADC operating mode, the in-phase pair 18 of ADCs is enabled and the quadrature-phase pair 20 of ADCs is enabled. As such, during the first ADC operating mode, the in-phase circuitry 12 and the quadrature-phase circuitry 14 may operate in a similar manner to the in-phase circuitry 12 and the quadrature-phase circuitry 14 described in the previous paragraph. Further, during the first ADC operating mode, the input bandwidth of the in-phase circuitry 12 is equal to about two times the ADC bandwidth, and the input bandwidth of the quadrature-phase circuitry 14 is equal to about two times the ADC bandwidth. Additionally, during the first ADC operating mode, the digital complex processing circuitry 16 combines, filters, and restructures the in-phase pair of sub-quadrature output signals and the quadrature-phase pair of sub-quadrature output signals to provide the digital in-phase output signal DIO and the digital quadrature-phase output signal DQO.

During the second ADC operating mode, one of the in-phase pair 18 of ADCs is enabled and another of the in-phase pair 18 of ADCs is disabled. Similarly, during the second ADC operating mode, one of the quadrature-phase pair 20 of ADCs is enabled and another of the quadrature-phase pair 20 of ADCs is disabled. Further, during the second ADC operating mode, the one of the in-phase pair 18 of ADCs that is enabled provides one of the in-phase pair of sub-quadrature output signals based on the analog in-phase input signal AII. Similarly, during the second ADC operating mode, the one of the quadrature-phase pair 20 of ADCs that is enabled provides one of the quadrature-phase pair of sub-quadrature output signals based on the analog quadrature-phase input signal AQI. Additionally, during the second ADC operating mode, the digital complex processing circuitry 16 forwards the one of the in-phase pair of sub-quadrature output signals from the one of the in-phase pair 18 of ADCs that is enabled to provide the digital in-phase output signal DIO. Similarly, during the second ADC operating mode, the digital complex processing circuitry 16 forwards the one of the quadrature-phase pair of sub-quadrature output signals from the one of the quadrature-phase pair 20 of ADCs that is enabled to provide the digital quadrature-phase output signal DQO.

In one embodiment of the half-bandwidth based quadrature ADC 10, during the second ADC operating mode, a bandwidth of the analog in-phase input signal AII is less than or equal to about the ADC bandwidth. Further, during the second ADC operating mode, a bandwidth of the analog quadrature-phase input signal AQI is less than or equal to about the ADC bandwidth. By disabling one of the in-phase pair 18 of ADCs and one of the quadrature-phase pair 20 of ADCs during the second ADC operating mode, current consumption may be reduced, thereby increasing battery life. In this regard, the second ADC operating mode may be selected when the bandwidths of the analog in-phase input signal AII and the analog quadrature-phase input signal AQI are low enough to warrant disabling one of the in-phase pair 18 of ADCs and disabling one of the quadrature-phase pair 20 of ADCs. Conversely, the first ADC operating mode may be selected when the bandwidths of the analog in-phase input signal AII and the analog quadrature-phase input signal AQI are high enough to preclude disabling one of the in-phase pair 18 of ADCs and disabling one of the quadrature-phase pair 20 of ADCs.

Figure 3:
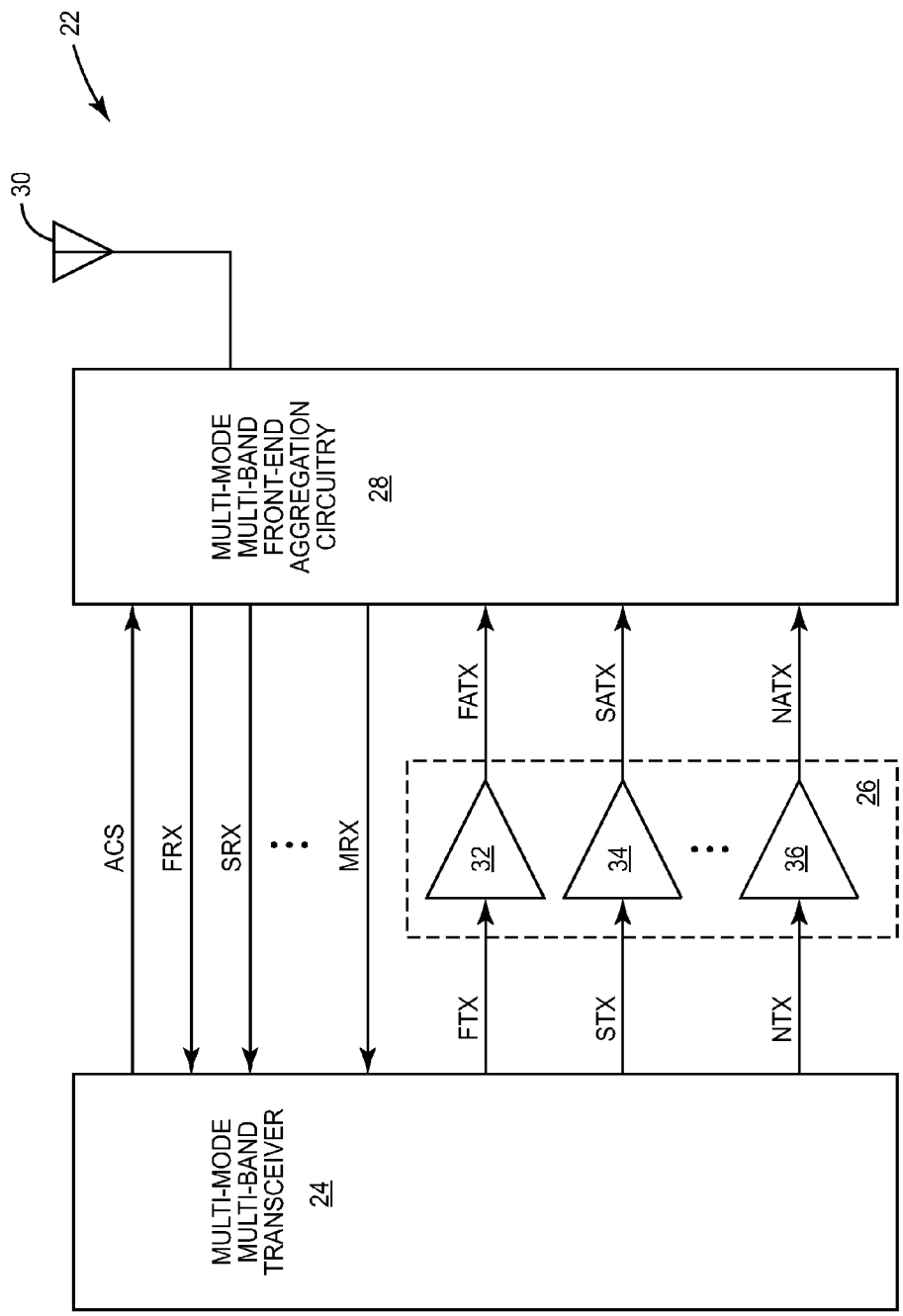
FIG. 3 shows a multi-mode multi-band communications terminal according to one embodiment of the present disclosure.

FIG. 3 shows a multi-mode multi-band communications terminal 22 according to one embodiment of the present disclosure. The multi-mode multi-band communications terminal 22 includes a multi-mode multi-band transceiver 24, multi-mode multi-band PA circuitry 26, multi-mode multi-band front-end aggregation circuitry 28, and an antenna 30. The multi-mode multi-band PA circuitry 26 includes a first PA 32, a second PA 34, and up to and including an $N^{TH}$ PA 36.

The multi-mode multi-band transceiver 24 may select one of multiple communications modes, multiple RF modulation modes, or any combination thereof. Further, the multi-mode multi-band transceiver 24 may select one of multiple frequency bands. The multi-mode multi-band transceiver 24 provides an aggregation control signal ACS to the multi-mode multi-band front-end aggregation circuitry 28 based on the selected mode and the selected frequency band. The multi-mode multi-band front-end aggregation circuitry 28 may include various RF components, including RF switches; RF filters, such as bandpass filters, harmonic filters, and duplexers; RF amplifiers, such as low noise amplifiers (LNAs); impedance matching circuitry; the like; or any combination thereof. In this regard, routing of RF receive signals and RF transmit signals through the RF components may be based on the selected mode and the selected frequency band as directed by the aggregation control signal ACS.

The first PA 32 may receive and amplify a first RF transmit signal FTX from the multi-mode multi-band transceiver 24 to provide a first amplified RF transmit signal FATX to the antenna 30 via the multi-mode multi-band front-end aggregation circuitry 28. The second PA 34 may receive and amplify a second RF transmit signal STX from the multi-mode multi-band transceiver 24 to provide a second RF amplified transmit signal SATX to the antenna 30 via the multi-mode multi-band front-end aggregation circuitry 28. The $N^{TH}$ PA 36 may receive and amplify an $N^{TH}$ RF transmit signal NTX from the multi-mode multi-band transceiver 24 to provide an $N^{TH}$ RF amplified transmit signal NATX to the antenna 30 via the multi-mode multi-band front-end aggregation circuitry 28.

The multi-mode multi-band transceiver 24 may receive a first RF receive signal FRX, a second RF receive signal SRX, and up to and including an $M^{TH}$ RF receive signal MRX from the antenna 30 via the multi-mode multi-band front-end aggregation circuitry 28. Each of the RF receive signals FRX, SRX, MRX may be associated with at least one selected mode, at least one selected frequency band, or both. Similarly, each of the RF transmit signals FTX, STX, NTX and corresponding amplified RF transmit signals FATX, SATX, NATX may be associated with at least one selected mode, at least one selected frequency band, or both.

Figure 4:
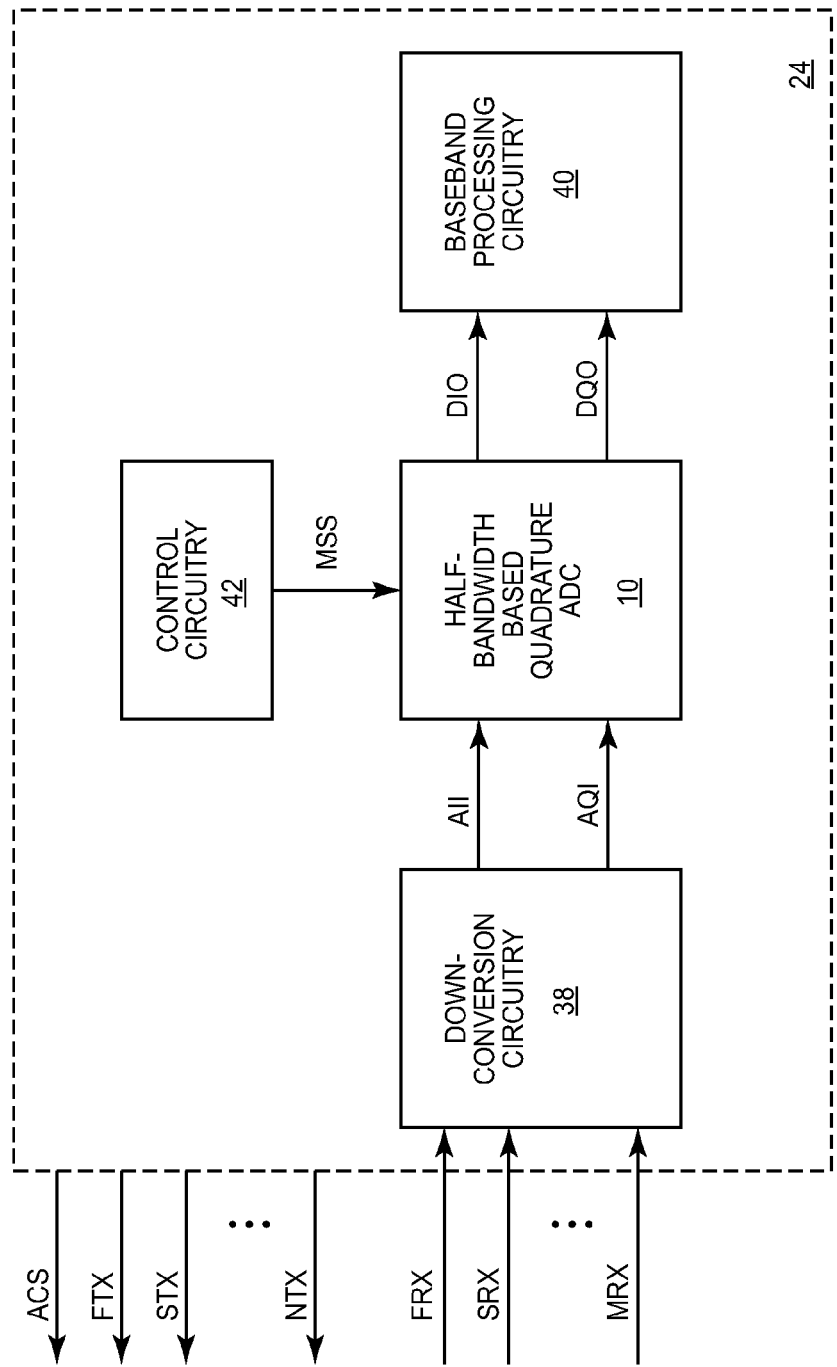
FIG. 4 shows details of a multi-mode multi-band transceiver illustrated in FIG. 3 according to one embodiment of the multi-mode multi-band transceiver.

FIG. 4 shows details of the multi-mode multi-band transceiver 24 illustrated in FIG. 3 according to one embodiment of the multi-mode multi-band transceiver 24. The multi-mode multi-band transceiver 24 includes down-conversion circuitry 38, the half-bandwidth based quadrature ADC 10, baseband processing circuitry 40, and control circuitry 42. The down-conversion circuitry 38 receives the RF receive signals FRX, SRX, MRX and provides the analog in-phase input signal AII and the analog quadrature-phase input signal AQI based on down-converting an active one of the RF receive signals FRX, SRX, MRX. In one embodiment of the multi-mode multi-band transceiver 24, the down-conversion circuitry 38 down-converts the first RF receive signal FRX to provide the analog in-phase input signal AII and the analog quadrature-phase input signal AQI. The half-bandwidth based quadrature ADC 10 analog-to-digital converts the analog in-phase input signal AII and the analog quadrature-phase input signal AQI to provide the digital in-phase output signal DIO and the digital quadrature-phase output signal DQO. The baseband processing circuitry 40 receives and processes the digital in-phase output signal DIO and the digital quadrature-phase output signal DQO.

The control circuitry 42 selects the one of the multiple ADC operating modes in which the half-bandwidth based quadrature ADC 10 operates. As such, the control circuitry 42 indicates which mode is selected to the half-bandwidth based quadrature ADC 10 via a mode select signal MSS. In one embodiment of the first RF receive signal FRX, the first RF receive signal FRX has a relatively high bandwidth, such as with high bandwidth long term evolution (LTE). As such, the control circuitry 42 selects the first ADC operating mode. In a first exemplary embodiment of the first RF receive signal FRX, the first RF receive signal FRX has a bandwidth equal to about 20 megahertz. In an alternate embodiment of the first RF receive signal FRX, the first RF receive signal FRX has a relatively low bandwidth, such as with low bandwidth LTE, enhanced general packet radio service (EGPRS), or wideband code division multiple access (WCDMA). As such, the control circuitry 42 selects the second ADC operating mode to save power. In a second exemplary embodiment of the first RF receive signal FRX, the first RF receive signal FRX has a bandwidth less than or equal to about 10 megahertz.

Figure 5:
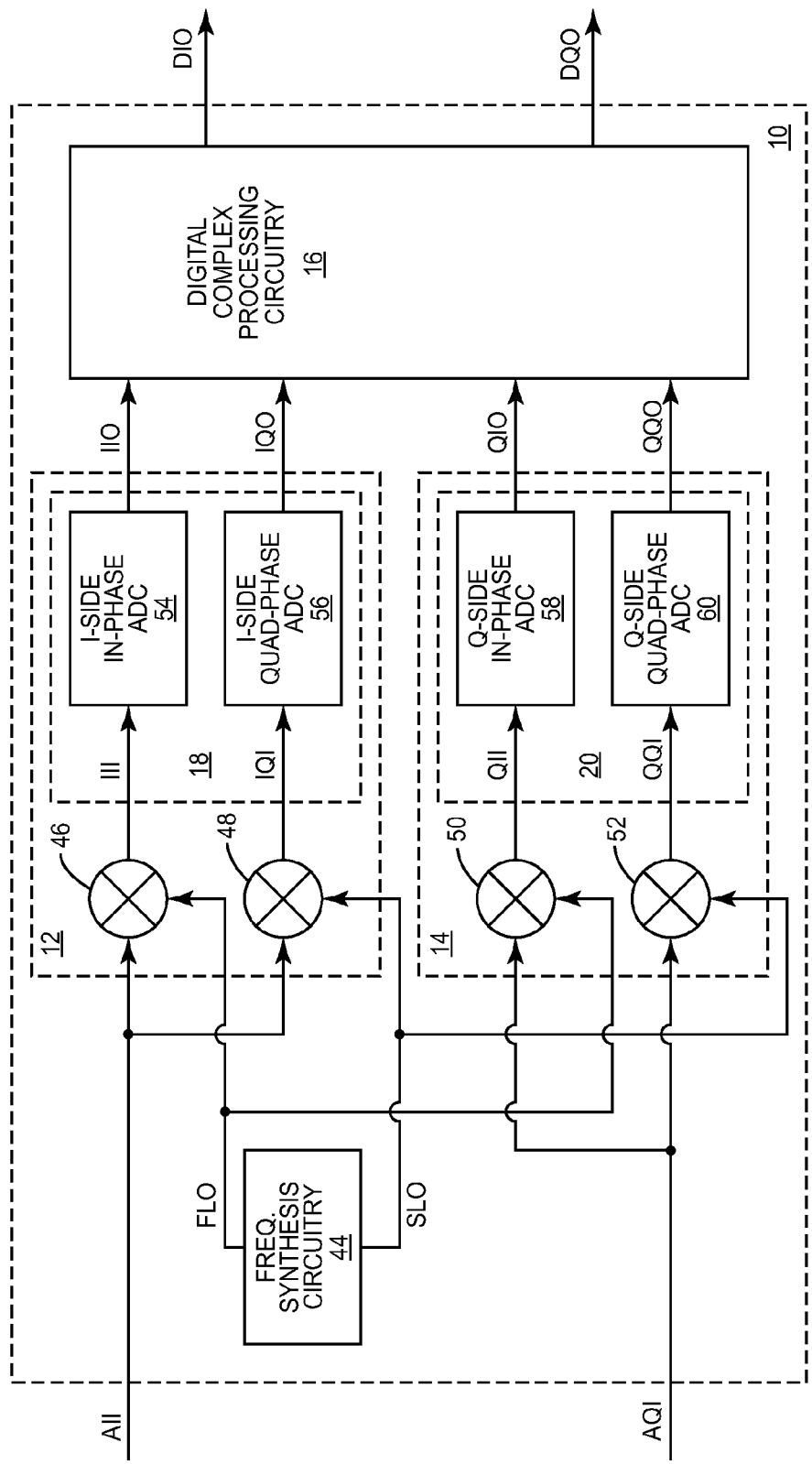
FIG. 5 shows details of the in-phase circuitry and the quadrature-phase circuitry illustrated in FIG. 2 according to one embodiment of the in-phase circuitry and the quadrature-phase circuitry.

FIG. 5 shows details of the in-phase circuitry 12 and the quadrature-phase circuitry 14 illustrated in FIG. 2 according to one embodiment of the in-phase circuitry 12 and the quadrature-phase circuitry 14. The half-bandwidth based quadrature ADC 10 illustrated in FIG. 5 is similar to the half-bandwidth based quadrature ADC 10 illustrated in FIG. 2, except the half-bandwidth based quadrature ADC 10 illustrated in FIG. 5 further includes frequency synthesis circuitry 44, which provides a first local oscillator (LO) signal FLO and a second LO signal SLO. Additionally, the in-phase circuitry 12 further includes an I-side in-phase multiplier 46 and an I-side quadrature-phase multiplier 48. The quadrature-phase circuitry 14 further includes a Q-side in-phase multiplier 50 and a Q-side quadrature-phase multiplier 52. The in-phase pair 18 of ADCs includes an I-side in-phase ADC 54 and an I-side quadrature-phase ADC 56. The quadrature-phase pair 20 of ADCs includes a Q-side in-phase ADC 58 and a Q-side quadrature-phase ADC 60.

The I-side in-phase multiplier 46 receives the analog in-phase input signal AII and the first LO signal FLO. The I-side quadrature-phase multiplier 48 receives the analog in-phase input signal AII and the second LO signal SLO. The Q-side in-phase multiplier 50 receives the analog quadrature-phase input signal AQI and the first LO signal FLO. The Q-side quadrature-phase multiplier 52 receives the analog quadrature-phase input signal AQI and the second LO signal SLO. The I-side in-phase multiplier 46 provides an I-side in-phase input signal III based on multiplying the analog in-phase input signal AII times the first LO signal FLO. The I-side quadrature-phase multiplier 48 provides an I-side quadrature-phase input signal IQI based on multiplying the analog in-phase input signal AII times the second LO signal SLO. The Q-side in-phase multiplier 50 provides a Q-side in-phase input signal QII based on multiplying the analog quadrature-phase input signal AQI tines the first LO signal FLO. The Q-side quadrature-phase multiplier 52 provides the Q-side quadrature-phase input signal QQI based on multiplying the analog quadrature-phase input signal AQI times the second LO signal SLO. In one embodiment of the frequency synthesis circuitry 44, the second LO signal SLO is phase-shifted from the first LO signal FLO by about 90 degrees.

The I-side in-phase ADC 54 receives and analog-to-digital converts the I-side in-phase input signal III to provide the I-side in-phase output signal IIO. The I-side quadrature-phase ADC 56 receives and analog-to-digital converts the I-side quadrature-phase input signal IQI to provide the I-side quadrature-phase output signal 100. The Q-side in-phase ADC 58 receives and analog-to-digital converts the Q-side in-phase input signal QII to provide the Q-side in-phase output signal QIO. The Q-side quadrature-phase ADC 60 receives and analog-to-digital converts the Q-side quadrature-phase input signal QQI to provide the Q-side quadrature-phase output signal QQO. As such, the in-phase pair of sub-quadrature output signals is based on the I-side in-phase input signal III and the I-side quadrature-phase input signal IQI. Further, the quadrature-phase pair of sub-quadrature output signals is based on the Q-side in-phase input signal QII and the Q-side quadrature-phase input signal QQI. The I-side in-phase output signal IIO is based on the I-side in-phase input signal III. The I-side quadrature-phase output signal IQO is based on the I-side quadrature-phase input signal 101. The Q-side in-phase output signal QIO is based on the Q-side in-phase input signal QII. The Q-side quadrature-phase output signal QQO is based on the Q-side quadrature-phase input signal QQI. The digital complex processing circuitry 16 combines, filters, and restructures the I-side in-phase output signal IIO, the I-side quadrature-phase output signal IQO, the Q-side in-phase output signal QIO, and the Q-side quadrature-phase output signal QQO to provide the digital in-phase output signal DIO and the digital quadrature-phase output signal DQO.

In one embodiment of the I-side in-phase ADC 54, the I-side quadrature-phase ADC 56, the Q-side in-phase ADC 58, and the Q-side quadrature-phase ADC 60, each of the I-side in-phase ADC 54, the I-side quadrature-phase ADC 56, the Q-side in-phase ADC 58, and the Q-side quadrature-phase ADC 60 is a lowpass ADC having about the ADC bandwidth. In an alternate embodiment of the I-side in-phase ADC 54, the I-side quadrature-phase ADC 56, the Q-side in-phase ADC 58, and the Q-side quadrature-phase ADC 60, each of the I-side in-phase ADC 54, the I-side quadrature-phase ADC 56, the Q-side in-phase ADC 58, and the Q-side quadrature-phase ADC 60 is a sigma-delta ADC. In an additional embodiment of the I-side in-phase ADC 54, the I-side quadrature-phase ADC 56, the Q-side in-phase ADC 58, and the Q-side quadrature-phase ADC 60, each of the I-side in-phase ADC 54, the I-side quadrature-phase ADC 56, the Q-side in-phase ADC 58, and the Q-side quadrature-phase ADC 60 is a lowpass sigma-delta ADC having about the ADC bandwidth.

Sigma-delta ADCs may provide low power consumption and good linearity. Further, there may be a trade-off between power consumption of sigma-delta ADCs and bandwidth of sigma-delta ADCs by controlling an over-sampling frequency of the sigma-delta ADCs. As such, in one embodiment of the I-side in-phase ADC 54, the I-side quadrature-phase ADC 56, the Q-side in-phase ADC 58, and the Q-side quadrature-phase ADC 60, during the first ADC operating mode, each of the I-side in-phase ADC 54, the I-side quadrature-phase ADC 56, the Q-side in-phase ADC 58, and the Q-side quadrature-phase ADC 60 has a first over-sampling frequency, and during the second ADC operating mode, each of the I-side in-phase ADC 54, the I-side quadrature-phase ADC 56, the Q-side in-phase ADC 58, and the Q-side quadrature-phase ADC 60 has a second over-sampling frequency. In one embodiment of the digital complex processing circuitry 16, the digital complex processing circuitry 16 includes at least one notch filter to reduce the effects of quantization noise from each sigma-delta ADC.

In one embodiment of the I-side in-phase multiplier 46, the I-side quadrature-phase multiplier 48, the Q-side in-phase multiplier 50, and the Q-side quadrature-phase multiplier 52, each of the I-side in-phase multiplier 46, the I-side quadrature-phase multiplier 48, the Q-side in-phase multiplier 50, and the Q-side quadrature-phase multiplier 52, is a mixer. In this regard, the I-side in-phase multiplier 46 provides the I-side in-phase input signal III based on mixing the analog in-phase input signal AII and the first LO signal FLO. The I-side quadrature-phase multiplier 48 provides the I-side quadrature-phase input signal IQI based on mixing the analog in-phase input signal AII and the second LO signal SLO. The Q-side in-phase multiplier 50 provides the Q-side in-phase input signal AII based on mixing the analog quadrature-phase input signal AQI and the first LO signal FLO. The Q-side quadrature-phase multiplier 52 provides the Q-side quadrature-phase input signal QQI based on mixing the analog quadrature-phase input signal AQI and the second LO signal SLO. In an alternate embodiment of the I-side in-phase multiplier 46, the I-side quadrature-phase multiplier 48, the Q-side in-phase multiplier 50, and the Q-side quadrature-phase multiplier 52, each of the I-side in-phase multiplier 46, the I-side quadrature-phase multiplier 48, the Q-side in-phase multiplier 50, and the Q-side quadrature-phase multiplier 52, is a switching mixer.

Figure 6:
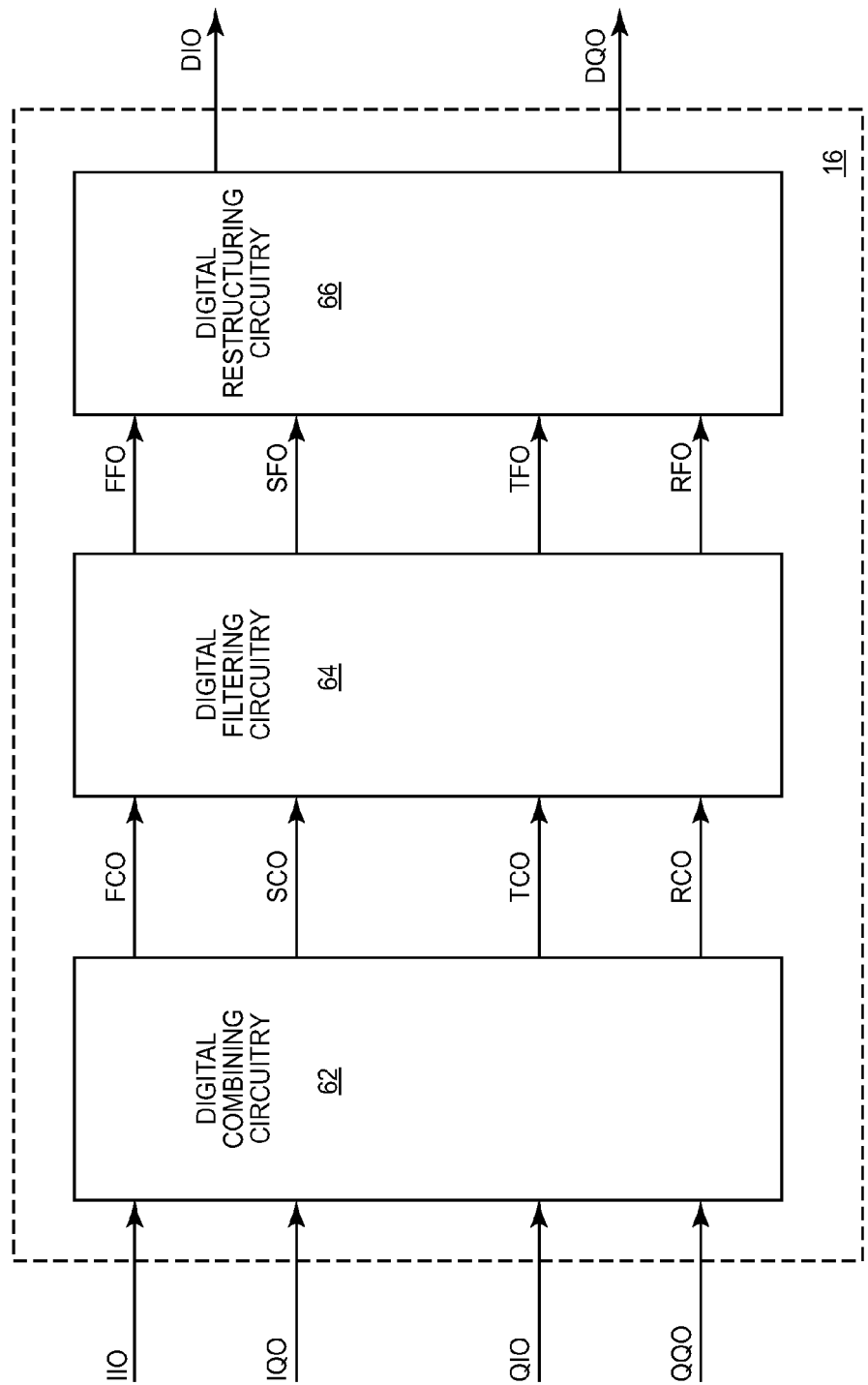
FIG. 6 shows details of digital complex processing circuitry illustrated in FIG. 1 according to one embodiment of the digital complex processing circuitry.

FIG. 6 shows details of the digital complex processing circuitry 16 illustrated in FIG. 1 according to one embodiment of the digital complex processing circuitry 16. The digital complex processing circuitry 16 includes digital combining circuitry 62, digital filtering circuitry 64, and digital restructuring circuitry 66. The digital combining circuitry 62 receives the I-side in-phase output signal IIO, the I-side quadrature-phase output signal IQO, the Q-side in-phase output signal QIO, and the Q-side quadrature-phase output signal QQO. The digital combining circuitry 62 provides a first combined output signal FCO, a second combined output signal SCO, a third combined output signal TCO, and a fourth combined output signal RCO to the digital filtering circuitry 64 based on the I-side in-phase output signal IIO, the I-side quadrature-phase output signal 100, the Q-side in-phase output signal QIO, and the Q-side quadrature-phase output signal QQO.

In one embodiment of the digital combining circuitry 62, the first combined output signal FCO is based on a combination of at least two of the I-side in-phase output signal IIO, the I-side quadrature-phase output signal IQO, the Q-side in-phase output signal QIO, and the Q-side quadrature-phase output signal QQO. The second combined output signal SCO is based on a combination of at least two of the I-side in-phase output signal IIO, the I-side quadrature-phase output signal IQO, the Q-side in-phase output signal QIO, and the Q-side quadrature-phase output signal QQO. The third combined output signal TCO is based on a combination of at least two of the I-side in-phase output signal IIO, the I-side quadrature-phase output signal IQO, the Q-side in-phase output signal QIO, and the Q-side quadrature-phase output signal QQO. The fourth combined output signal RCO is based on a combination of at least two of the I-side in-phase output signal IIO, the I-side quadrature-phase output signal IQO, the Q-side in-phase output signal QIO, and the Q-side quadrature-phase output signal QQO.

The digital filtering circuitry 64 receives and filters the first combined output signal FCO to provide a first filtered output signal FFO, receives and filters the second combined output signal SCO to provide a second filtered output signal SFO, receives and filters a third combined output signal TCO to provide a third filtered output signal TFO, and receives and filters the fourth combined output signal RCO to provide a fourth filtered output signal RFO. The digital restructuring circuitry 66 receives and restructures the first filtered output signal FFO, the second filtered output signal SFO, the third filtered output signal TFO, and the fourth filtered output signal RFO to provide the digital in-phase output signal DIO and the digital quadrature-phase output signal DQO. In this regard, the digital in-phase output signal DIO and the digital quadrature-phase output signal DQO are further based on the first combined output signal FCO, the second combined output signal SCO, the third combined output signal TCO, and the fourth combined output signal RCO. Additionally, the digital in-phase output signal DIO and the digital quadrature-phase output signal DQO are further based on the first filtered output signal FFO, the second filtered output signal SFO, the third filtered output signal TFO, and the fourth filtered output signal RFO.

Figure 7:
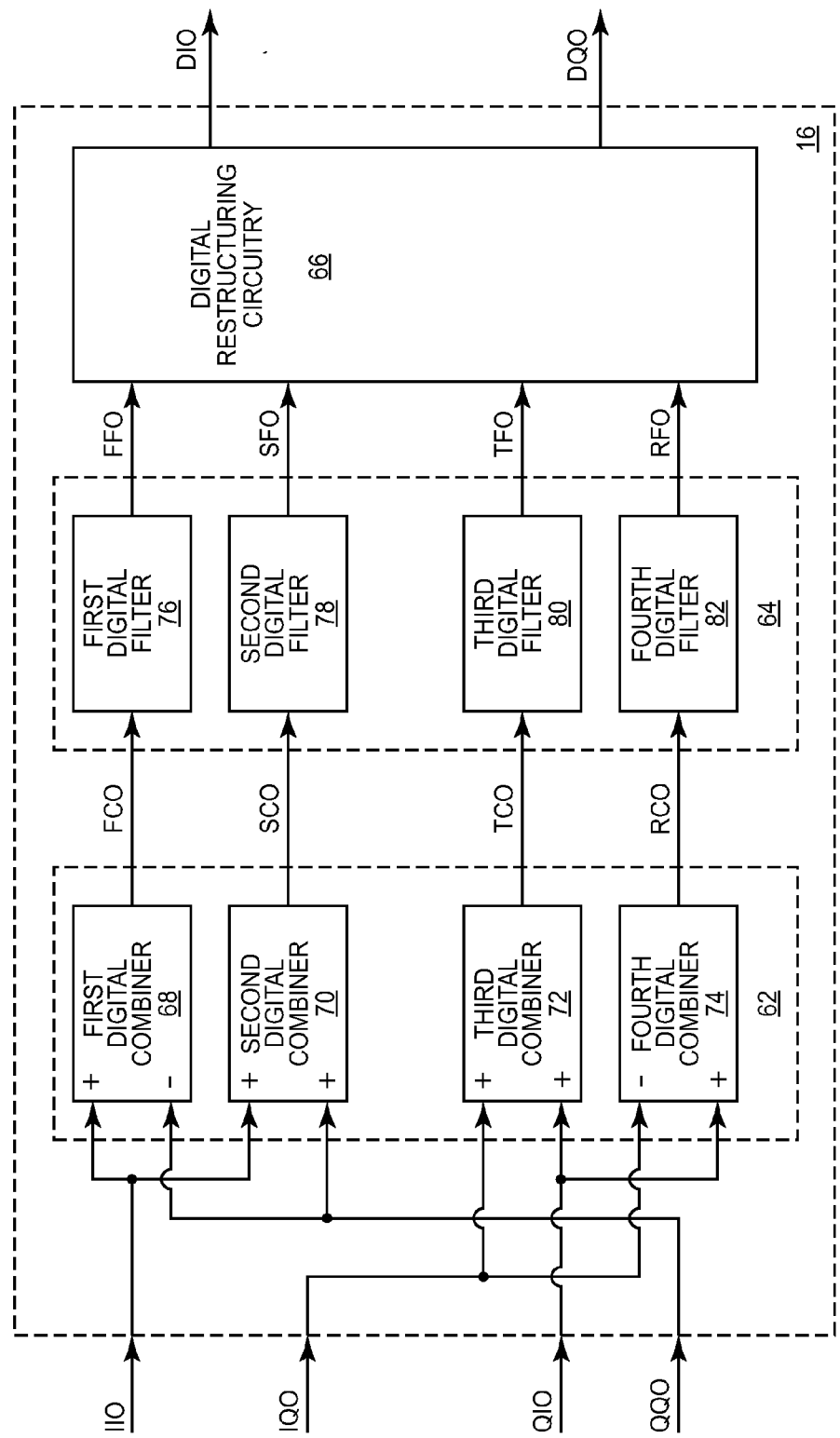
FIG. 7 shows details of digital combining circuitry and digital filtering circuitry illustrated in FIG. 6 according to one embodiment of the digital combining circuitry and the digital filtering circuitry.

FIG. 7 shows details of the digital combining circuitry 62 and the digital filtering circuitry 64 illustrated in FIG. 6 according to one embodiment of the digital combining circuitry 62 and the digital filtering circuitry 64. The digital complex processing circuitry 16 illustrated in FIG. 7 is similar to the digital complex processing circuitry 16 illustrated in FIG. 6; except in the digital complex processing circuitry 16 illustrated in FIG. 7; the digital combining circuitry 62 includes a first digital combiner 68, a second digital combiner 70, a third digital combiner 72, and a fourth digital combiner 74; and the digital filtering circuitry 64 includes a first digital filter 76, a second digital filter 78, a third digital filter 80, and a fourth digital filter 82.

The first digital combiner 68 receives and combines the I-side in-phase output signal IIO and the Q-side quadrature-phase output signal QQO to provide the first combined output signal FCO, such that the first combined output signal FCO is based on a difference between the I-side in-phase output signal IIO and the Q-side quadrature-phase output signal QQO. In one embodiment of the first digital combiner 68, the first combined output signal FCO is based on the I-side in-phase output signal IIO minus the Q-side quadrature-phase output signal QQO. The second digital combiner 70 receives and combines the I-side in-phase output signal IIO and the Q-side quadrature-phase output signal QQO to provide the second combined output signal SCO, such that the second combined output signal SCO is based on a sum of the I-side in-phase output signal IIO and the Q-side quadrature-phase output signal QQO.

The third digital combiner 72 receives and combines the I-side quadrature-phase output signal IQO and the Q-side in-phase output signal QIO to provide the third combined output signal TCO, such that the third combined output signal TCO is based on a sum of the I-side quadrature-phase output signal IQO and the Q-side in-phase output signal QIO. The fourth digital combiner 74 receives and combines the I-side quadrature-phase output signal IQO and the Q-side in-phase output signal QIO to provide the fourth combined output signal RCO, such that the fourth combined output signal RCO is based on a difference between the I-side quadrature-phase output signal IQO and the Q-side in-phase output signal QIO. In one embodiment of the fourth digital combiner 74, the fourth combined output signal RCO is based on the Q-side in-phase output signal QIO minus the I-side quadrature-phase output signal IQO.

The first digital filter 76 receives and filters the first combined output signal FCO to provide the first filtered output signal FFO, such that the first filtered output signal FFO is based on filtering and a difference between the I-side in-phase output signal IIO and the Q-side quadrature-phase output signal QQO. The second digital filter 78 receives and filters the second combined output signal SCO to provide the second filtered output signal SFO, such that the second filtered output signal SFO is based on filtering and a sum of the I-side in-phase output signal IIO and the Q-side quadrature-phase output signal QQO. The third digital filter 80 receives and filters the third combined output signal TCO to provide the third filtered output signal TFO based on filtering and a sum of the I-side quadrature-phase output signal IQO and the Q-side in-phase output signal QIO. The fourth digital filter 82 receives and filters the fourth combined output signal RCO to provide the fourth filtered output signal RFO based on filtering and a difference between the I-side quadrature-phase output signal IQO and the Q-side in-phase output signal QIO.

In one embodiment of the digital filtering circuitry 64, each of the first digital filter 76, the second digital filter 78, the third digital filter 80, and the fourth digital filter 82 is a half band filter. In an alternate embodiment of the digital filtering circuitry 64, each of the first digital filter 76, the second digital filter 78, the third digital filter 80, and the fourth digital filter 82 is a half band filter, has a sampling frequency, and has a half band break frequency, such that the half band break frequency is about equal to the sampling frequency divided by an integer. Larger values of the integer may require more processing power, but may provide better filtering characteristics. In an exemplary embodiment of the digital filtering circuitry 64, the integer is equal to eight.

FIG. 8A shows the first RF receive signal FRX provided by the multi-mode multi-band RF communications terminal 22 illustrated in FIG. 3 according to one embodiment of the multi-mode multi-band RF communications terminal 22. The first RF receive signal FRX has a center frequency $F_C$ and a first receive modulation band 84 approximately centered about the center frequency $F_C$. The first receive modulation band 84 has a modulation bandwidth 86. The first receive modulation band 84 includes a first sub-band 88, a second sub-band 90, a third sub-band 92, and a fourth sub-band 94. Each of the first sub-band 88, the second sub-band 90, the third sub-band 92, and the fourth sub-band 94 has a sub-band bandwidth 96. Since the first receive modulation band 84 is divided into four equal sub-bands, the modulation bandwidth 86 is equal to four times the sub-band bandwidth 96.

As previously mentioned, the first RF receive signal FRX (FIG. 4) is down-converted to provide the analog in-phase input signal AII (FIG. 4) and the analog quadrature-phase input signal AQI (FIG. 4). As such, the analog in-phase input signal AII (FIG. 4) and the analog quadrature-phase input signal AQI (FIG. 4) are representative of the first RF receive signal FRX (FIG. 4).

FIG. 8B shows a first manipulation of the first RF receive signal FRX illustrated in FIG. 8A according to one embodiment of the half-bandwidth based quadrature ADC 10 (FIG. 5). FIG. 8C shows a second manipulation of the first RF receive signal FRX illustrated in FIG. 8A according to one embodiment of the half-bandwidth based quadrature ADC 10 (FIG. 5). By multiplying the first LO signal FLO (FIG. 5) times the analog in-phase input signal AII (FIG. 5), multiplying the first LO signal FLO (FIG. 5) times the analog quadrature-phase input signal AQI (FIG. 5), multiplying the second LO signal SLO (FIG. 5) times the analog in-phase input signal AII (FIG. 5), and multiplying the second LO signal SLO (FIG. 5) times the analog quadrature-phase input signal AQI (FIG. 5), frequency-shifts are imparted to the analog in-phase input signal AII (FIG. 5) and the analog quadrature-phase input signal AQI (FIG. 5).

Since the analog in-phase input signal AII (FIG. 5) and the analog quadrature-phase input signal AQI (FIG. 5) are representative of the first RF receive signal FRX, it is useful to examine such frequency-shifts as applied to the first RF receive signal FRX (FIG. 4). FIG. 8B shows a downward frequency shift and FIG. 8C shows an upward frequency shift. If frequencies of the first LO signal FLO (FIG. 5) and the second LO signal SLO (FIG. 5) are numerically about equal to the sub-band bandwidth 96, then the frequency shifts are numerically about equal to the sub-band bandwidth 96. In this regard, the first sub-band 88 and the second sub-band 90 are approximately centered about the center frequency $F_C$ as shown in FIG. 8B. The third sub-band 92 and the fourth sub-band 94 are approximately centered about the center frequency $F_C$ as shown in FIG. 8C. As a result, after down-converting and multiplying of the first RF receive signal FRX, the modulation information of the first RF receive signal FRX is included in signals that have bandwidths within the sub-band bandwidth 96.

Specifically, the modulation information of the first RF receive signal FRX is included in a combination of the I-side in-phase input signal III (FIG. 5), the I-side quadrature-phase input signal 101 (FIG. 5), the Q-side in-phase input signal QII (FIG. 5), and the Q-side quadrature-phase input signal QQI (FIG. 5). Further, the sub-band bandwidth 96 is within the ADC bandwidth. As a result, the I-side in-phase ADC 54 (FIG. 5), the I-side quadrature-phase ADC 56 (FIG. 5), the Q-side in-phase ADC 58 (FIG. 5), the Q-side quadrature-phase ADC 60 (FIG. 5) may convert the I-side in-phase input signal III (FIG. 5), the I-side quadrature-phase input signal IQI (FIG. 5), the Q-side in-phase input signal QII (FIG. 5), and the Q-side quadrature-phase input signal QQI (FIG. 5), which are analog signals, into the I-side in-phase output signal IIO (FIG. 5), the I-side quadrature-phase output signal IQO (FIG. 5), the Q-side in-phase output signal QIO (FIG. 5), and the Q-side quadrature-phase output signal QQO (FIG. 5), which are digital signals, without losing the information needed to construct the digital in-phase output signal DIO (FIG. 5) and the digital quadrature-phase output signal DQO (FIG. 5).

FIG. 9A is a duplication of the first RF receive signal FRX illustrated in FIG. 8A for clarity. FIG. 9B shows the analog in-phase input signal AII illustrated in FIG. 5 according to one embodiment of the half-bandwidth based quadrature ADC 10

(FIG. 5). FIG. 9C shows the analog quadrature-phase input signal AQI illustrated in FIG. 5 according to one embodiment of the half-bandwidth based quadrature ADC 10 (FIG. 5). FIG. 9D shows the I-side in-phase output signal IIO illustrated in FIG. 5 according to one embodiment of the half-bandwidth based quadrature ADC 10 (FIG. 5).

The first RF receive signal FRX has the first receive modulation band 84 with the modulation bandwidth 86 (FIG. 8A). The analog in-phase input signal AII has an in-phase input band 98 with an in-phase input bandwidth 100. The analog quadrature-phase input signal AQI has a quadrature-phase input band 102 with a quadrature-phase input bandwidth 104. A combination of information encoded in the in-phase input band 98, information encoded in the quadrature-phase input band 102, and a phase-shift between the analog in-phase input signal AII and the analog quadrature-phase input signal AQI is representative of information encoded in the first receive modulation band 84. In one embodiment of the half-bandwidth based quadrature ADC 10 (FIG. 5), the modulation bandwidth 86 (FIG. 8A) is equal to about two times the in-phase input bandwidth 100 and equal to about two times the quadrature-phase input bandwidth 104.

The I-side in-phase output signal IIO has a sub-quadrature band 106 with a sub-quadrature bandwidth 108. Similarly, each of the I-side quadrature-phase output signal 100 (FIG. 5), the Q-side in-phase output signal QIO (FIG. 5), and the Q-side quadrature-phase output signal QQO (FIG. 5) has a corresponding sub-quadrature band 106 with a corresponding sub-quadrature bandwidth 108. A combination of information encoded in the sub-quadrature band 106 of the I-side in-phase output signal IIO, information encoded in the sub-quadrature band 106 of the I-side quadrature-phase output signal IQO (FIG. 5), and a phase-shift between the I-side in-phase output signal IIO and the I-side quadrature-phase output signal IQO (FIG. 5) is representative of information encoded in the in-phase input band 98. Similarly, a combination of information encoded in the sub-quadrature band 106 of the Q-side in-phase output signal QIO (FIG. 5), information encoded in the sub-quadrature band 106 of the Q-side quadrature-phase output signal QQO (FIG. 5), and a phase-shift between the Q-side in-phase output signal QIO (FIG. 5) and the Q-side quadrature-phase output signal QQO (FIG. 5) is representative of information encoded in the quadrature-phase input band 102. In one embodiment of the half-bandwidth based quadrature ADC 10 (FIG. 5), the in-phase input bandwidth 100 is equal to about two times the sub-quadrature bandwidth 108 and the quadrature-phase input bandwidth 104 is equal to about two times the sub-quadrature bandwidth 108.

In general, information encoded in an RF signal, such as the first RF receive signal FRX, may be represented by encoded information in each of two down-converted quadrature signals, such as the analog in-phase input signal AII and the analog quadrature-phase input signal AQI. A bandwidth of each of the two down-converted quadrature signals may be equal to about one-half a bandwidth of the RF signal. Further, the encoded information in each of the two down-converted quadrature signals may be represented by encoded information in each of a corresponding pair of sub-quadrature signals, such as the I-side in-phase output signal IIO and the I-side quadrature-phase output signal IQO (FIG. 5) or the Q-side in-phase output signal QIO (FIG. 5) and the Q-side quadrature-phase output signal QQO (FIG. 5). A bandwidth of each of the sub-quadrature signals may be equal to about one-half the bandwidth of each of the two down-converted quadrature signals.

FIG. 10A is a duplication of the first RF receive signal FRX illustrated in FIG. 8A for clarity. FIG. 10B shows effects of filtering the first RF receive signal FRX illustrated in FIG. 8B according to one embodiment of the half-bandwidth based quadrature ADC 10 (FIG. 5). FIG. 10C shows effects of filtering the first RF receive signal FRX illustrated in FIG. 8C according to one embodiment of the half-bandwidth based quadrature ADC 10 (FIG. 5). Specifically, the first combined output signal FCO (FIG. 7), the second combined output signal SCO (FIG. 7), the third combined output signal TCO (FIG. 7) and the fourth combined output signal RCO (FIG. 7) are representative of the first RF receive signal FRX illustrated in FIG. 8B and the first RF receive signal FRX illustrated in FIG. 8C.

By filtering the first combined output signal FCO (FIG. 7), the second combined output signal SCO (FIG. 7), the third combined output signal TCO (FIG. 7), and the fourth combined output signal RCO (FIG. 7), the first digital filter 76 (FIG. 7), the second digital filter 78 (FIG. 7), the third digital filter 80 (FIG. 7), and the fourth digital filter 82 (FIG. 7) remove most of the lower half of the first receive modulation band 84 illustrated in FIG. 10B and remove most of the upper half of the first receive modulation band 84 illustrated in FIG. 10C. As such, most of the third sub-band 92 and the fourth sub-band 94 illustrated in FIG. 10B are intended to be removed and most of the first sub-band 88 and the second sub-band 90 illustrated in FIG. 10B are intended to be retained. However, a portion of the first sub-band 88, illustrated in FIG. 10B is removed and a portion of the third sub-band 92 is retained. Similarly, most of the first sub-band 88 and the second sub-band 90 illustrated in FIG. 10C are intended to be removed and most of the third sub-band 92 and the fourth sub-band 94 illustrated in FIG. 10C are intended to be retained. However, a portion of the third sub-band 92 illustrated in FIG. 10C is removed and a portion of the first sub-band 88 is retained.

If each of the first digital filter 76 (FIG. 7), the second digital filter 78 (FIG. 7), the third digital filter 80 (FIG. 7), and the fourth digital filter 82 (FIG. 7) has a symmetrical and proportional roll-off on both a high frequency side and a low frequency side, the portion of the first sub-band 88 that is retained approximately replaces the portion of the first sub-band 88 that is removed. Similarly, the portion of the third sub-band 92 that is retained approximately replaces the portion of the third sub-band 92 that is removed. As a result, the first filtered output signal FFO (FIG. 7), the second filtered output signal SFO (FIG. 7), the third filtered output signal TFO (FIG. 7), and the fourth filtered output signal RFO (FIG. 7) provide the proper proportions of information included in the first sub-band 88, the second sub-band 90, the third sub-band 92, and the fourth sub-band 94 to enable accurate reconstruction of the first receive modulation band 84 to provide the digital in-phase output signal DIO (FIG. 7) and the digital quadrature-phase output signal DQO (FIG. 7). A half band filter may have a symmetrical and proportional roll-off on both a high frequency side and a low frequency side.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. Circuitry comprising:
   in-phase circuitry comprising an in-phase pair of analog-to-digital converters (ADCs) adapted to provide an in-phase pair of sub-quadrature output signals based on an analog in-phase input signal, wherein each of the in-phase pair of ADCs has about an analog-to-digital converter (ADC) bandwidth and the in-phase circuitry has an input bandwidth, which is about equal to two times the ADC bandwidth;
   quadrature-phase circuitry comprising a quadrature-phase pair of ADCs adapted to provide a quadrature-phase pair of sub-quadrature output signals based on an analog quadrature-phase input signal; and
   digital complex processing circuitry adapted to process the in-phase pair of sub-quadrature output signals and the quadrature-phase pair of sub-quadrature output signals to provide a digital in-phase output signal and a digital quadrature-phase output signal,
   wherein the in-phase circuitry, the quadrature-phase circuitry, and the digital complex processing circuitry provide a half-bandwidth based quadrature ADC.

2. The circuitry of claim 1 wherein each of the quadrature-phase pair of ADCs has about the ADC bandwidth and the quadrature-phase circuitry has an input bandwidth, which is about equal to two times the ADC bandwidth.

3. The circuitry of claim 1 wherein the analog quadrature-phase input signal is phase-shifted from the analog in-phase input signal by about 90 degrees.

4. The circuitry of claim 1 wherein the input bandwidth is equal to about 10 megahertz and the ADC bandwidth is equal to about 5 megahertz.

5. The circuitry of claim 1 wherein the in-phase pair of sub-quadrature output signals includes an I-side in-phase output signal and an I-side quadrature-phase output signal, and the quadrature-phase pair of sub-quadrature output signals includes a Q-side in-phase output signal and a Q-side quadrature-phase output signal.

6. The circuitry of claim 5 wherein the digital complex processing circuitry comprises digital combining circuitry adapted to:
   combine the I-side in-phase output signal and the Q-side quadrature-phase output signal to provide a first combined output signal based on a difference between the I-side in-phase output signal and the Q-side quadrature-phase output signal;
   combine the I-side in-phase output signal and the Q-side quadrature-phase output signal to provide a second combined output signal based on a sum of the I-side in-phase output signal and the Q-side quadrature-phase output signal;
   combine the I-side quadrature-phase output signal and the Q-side in-phase output signal to provide a third combined output signal based on a sum of the I-side quadrature-phase output signal and the Q-side in-phase output signal; and
   combine the I-side quadrature-phase output signal and the Q-side in-phase output signal to provide a fourth combined output signal based on a difference between the I-side quadrature-phase output signal and the Q-side in-phase output signal,
   wherein the digital in-phase output signal and the digital quadrature-phase output signal are further based on the first combined output signal, the second combined output signal, the third combined output signal, and the fourth combined output signal.

7. The circuitry of claim 6 wherein the digital complex processing circuitry further comprises digital filtering circuitry adapted to:
   receive and filter the first combined output signal to provide a first filtered output signal;
   receive and filter the second combined output signal to provide a second filtered output signal;
   receive and filter the third combined output signal to provide a third filtered output signal; and
   receive and filter the fourth combined output signal to provide a fourth filtered output signal,
   wherein the digital in-phase output signal and the digital quadrature-phase output signal are further based on the first filtered output signal, the second filtered output signal, the third filtered output signal, and the fourth filtered output signal.

8. The circuitry of claim 7 wherein the digital complex processing circuitry further comprises digital restructuring circuitry adapted to receive and restructure the first filtered output signal, the second filtered output signal, the third filtered output signal, and the fourth filtered output signal to provide the digital in-phase output signal and the digital quadrature-phase output signal.

9. The circuitry of claim 5 wherein the digital complex processing circuitry further comprises digital filtering circuitry comprising:
   a first digital filter adapted to provide a first filtered output signal based on filtering and a difference between the I-side in-phase output signal and the Q-side quadrature-phase output signal;
   a second digital filter adapted to provide a second filtered output signal based on filtering and a sum of the I-side in-phase output signal and the Q-side quadrature-phase output signal;
   a third digital filter adapted to provide a third filtered output signal based on filtering and a sum of the I-side quadrature-phase output signal and the Q-side in-phase output signal; and
   a fourth digital filter adapted to provide a fourth filtered output signal based on filtering and a difference between the I-side quadrature-phase output signal and the Q-side in-phase output signal,
   wherein the digital in-phase output signal and the digital quadrature-phase output signal are further based on the first filtered output signal, the second filtered output signal, the third filtered output signal, and the fourth filtered output signal.

10. The circuitry of claim 9 wherein each of the first digital filter, the second digital filter, the third digital filter, and the fourth digital filter is a half band filter.

11. The circuitry of claim 10 wherein each of the first digital filter, the second digital filter, the third digital filter, and the fourth digital filter has a sampling frequency and a half band break frequency, such that the half band break frequency is about equal to the sampling frequency divided by an integer.

12. The circuitry of claim 11 wherein the integer is equal to eight.

13. The circuitry of claim 1 wherein:
the in-phase pair of ADCs comprises:
an I-side in-phase ADC adapted to provide an I-side in-phase output signal based on the analog in-phase input signal; and
an I-side quadrature-phase ADC adapted to provide an I-side quadrature-phase output signal based on the analog in-phase input signal; and
the quadrature-phase pair of ADCs comprises:
a Q-side in-phase ADC adapted to provide a Q-side in-phase output signal based on the analog quadrature-phase input signal; and
a Q-side quadrature-phase ADC adapted to provide a Q-side quadrature-phase output signal based on the analog quadrature-phase input signal,
wherein the in-phase pair of sub-quadrature output signals includes the I-side in-phase output signal and the I-side quadrature-phase output signal, and the quadrature-phase pair of sub-quadrature output signals includes the Q-side in-phase output signal and the Q-side quadrature-phase output signal.

14. The circuitry of claim 13 wherein each of the I-side in-phase ADC, the I-side quadrature-phase ADC, the Q-side in-phase ADC, and the Q-side quadrature-phase ADC is a lowpass ADC having about the ADC bandwidth.

15. The circuitry of claim 13 wherein each of the I-side in-phase ADC, the I-side quadrature-phase ADC, the Q-side in-phase ADC, and the Q-side quadrature-phase ADC is a sigma-delta ADC.

16. The circuitry of claim 15 wherein the digital complex processing circuitry includes at least one notch filter adapted to reduce effects of quantization noise from each sigma-delta ADC.

17. The circuitry of claim 1 wherein:
the in-phase circuitry further comprises:
an I-side in-phase multiplier adapted to provide an I-side in-phase input signal based on multiplying the analog in-phase input signal times a first local oscillator (LO) signal; and
an I-side quadrature-phase multiplier adapted to provide an I-side quadrature-phase input signal based on multiplying the analog in-phase input signal times a second LO signal; and
the quadrature-phase circuitry further comprises:
a Q-side in-phase multiplier adapted to provide a Q-side in-phase input signal based on multiplying the analog quadrature-phase input signal times the first LO signal; and
a Q-side quadrature-phase multiplier adapted to provide a Q-side quadrature-phase input signal based on multiplying the analog quadrature-phase input signal times the second LO signal,
wherein the in-phase pair of sub-quadrature output signals is further based on the I-side in-phase input signal and the I-side quadrature-phase input signal, and the quadrature-phase pair of sub-quadrature output signals is further based on the Q-side in-phase input signal and the Q-side quadrature-phase input signal.

18. The circuitry of claim 17 wherein the second LO signal is phase-shifted from the first LO signal by about 90 degrees.

19. The circuitry of claim 17 wherein the each of the I-side in-phase multiplier, the I-side quadrature-phase multiplier, the Q-side in-phase multiplier, and the Q-side quadrature-phase multiplier is a mixer.

20. The circuitry of claim 17 wherein the each of the I-side in-phase multiplier, the I-side quadrature-phase multiplier, the Q-side in-phase multiplier, and the Q-side quadrature-phase multiplier is a switching mixer.

21. The circuitry of claim 17 wherein:
the in-phase pair of ADCs comprises:
an I-side in-phase ADC adapted to analog-to-digital convert the I-side in-phase input signal to provide an I-side in-phase output signal; and
an I-side quadrature-phase ADC adapted to analog-to-digital convert the I-side quadrature-phase input signal to provide an I-side quadrature-phase output signal; and
the quadrature-phase pair of ADCs comprises:
a Q-side in-phase ADC adapted to analog-to-digital convert the Q-side in-phase input signal to provide a Q-side in-phase output signal; and
a Q-side quadrature-phase ADC adapted to analog-to-digital convert the Q-side quadrature-phase input signal to provide a Q-side quadrature-phase output signal,
wherein the in-phase pair of sub-quadrature output signals includes the I-side in-phase output signal and the I-side quadrature-phase output signal, and the quadrature-phase pair of sub-quadrature output signals includes the Q-side in-phase output signal and the Q-side quadrature-phase output signal.

22. The circuitry of claim 1 further comprising control circuitry, wherein:
the control circuitry is adapted to select one of a plurality of ADC operating modes;
the plurality of ADC operating modes includes at least a first ADC operating mode and a second ADC operating mode;
during the first ADC operating mode, the in-phase pair of ADCs is enabled;
during the first ADC operating mode, the quadrature-phase pair of ADCs is enabled;
during the first ADC operating mode, the digital complex processing circuitry is adapted to combine, filter, and restructure the in-phase pair of sub-quadrature output signals and the quadrature-phase pair of sub-quadrature output signals to provide the digital in-phase output signal and the digital quadrature-phase output signal;
during the second ADC operating mode, one of the in-phase pair of ADCs is enabled and another of the in-phase pair of ADCs is disabled;
during the second ADC operating mode, one of the quadrature-phase pair of ADCs is enabled and another of the quadrature-phase pair of ADCs is disabled.

23. The circuitry of claim 22 wherein during the second ADC operating mode:
a bandwidth of the analog in-phase input signal is less than or equal to about the ADC bandwidth;
the one of the in-phase pair of ADCs provides one of the in-phase pair of sub-quadrature output signals based on the analog in-phase input signal;
a bandwidth of the analog quadrature-phase input signal is less than or equal to about the ADC bandwidth;
the one of the quadrature-phase pair of ADCs provides one of the quadrature-phase pair of sub-quadrature output signals based on the analog quadrature-phase input signal;
the digital complex processing circuitry is adapted to forward the one of the in-phase pair of sub-quadrature output signals to provide the digital in-phase output signal; and the digital complex processing circuitry is further adapted to forward the one of the quadrature-phase pair of sub-quadrature output signals to provide the digital quadrature-phase output signal.

24. The circuitry of claim 23 further comprising:

multi-mode multi-band front-end aggregation circuitry adapted to provide a radio frequency (RF) receive signal;

down-conversion circuitry adapted to down-convert the RF receive signal to provide the analog in-phase input signal and the analog quadrature-phase input signal; and baseband processing circuitry adapted to receive and process the digital in-phase output signal and the digital quadrature-phase output signal.

25. A method comprising:

providing in-phase circuitry comprising an in-phase pair of analog-to-digital converter (ADC)s, quadrature-phase circuitry comprising a quadrature-phase pair of ADCs, and digital complex processing circuitry;

providing an in-phase pair of sub-quadrature output signals based on an analog in-phase input signal, wherein each of the in-phase pair of ADCs has about an ADC bandwidth and the in-phase circuitry has an input bandwidth, which is about equal to two times the ADC bandwidth;

providing a quadrature-phase pair of sub-quadrature output signals based on an analog quadrature-phase input signal; and combining, filtering, and restructuring the in-phase pair of sub-quadrature output signals and the quadrature-phase pair of sub-quadrature output signals to provide a digital in-phase output signal and a digital quadrature-phase output signal.

* * * * *